US010661217B2

(12) United States Patent
Price et al.

(10) Patent No.: US 10,661,217 B2
(45) Date of Patent: May 26, 2020

(54) ABATEMENT APPARATUS (71) Applicant: Edwards Limited, Burgess Hill, West Sussex (GB)

(72) Inventors: Duncan Michael Price, Clevedon (GB); Gary Peter Knight, Clevedon (GB)

(73) Assignee: Edwards Limited, Burgess Hill, West Sussex (GB)

(*) Notice: Subject to any disclaimer, the term of this patent is extended or adjusted under 35 U.S.C. 154(b) by 135 days.

(21) Appl. No.: 15/756,428

(22) PCT Filed: Aug. 22, 2016

(86) PCT No.: PCT/GB2016/052598
§ 371 (c)(1),
(2) Date: Feb. 28, 2018

(87) PCT Pub. No.: WO2017/037419
PCT Pub. Date: Mar. 9, 2017

(65) Prior Publication Data
US 2018/0311607 A1 Nov. 1, 2018

(30) Foreign Application Priority Data

Sep. 1, 2015 (GB) .................................. 1515489.1

(51) Int. Cl.
*B01D 53/00* (2006.01)
*F23D 14/16* (2006.01)
(Continued)

(52) U.S. Cl.
CPC .......... *B01D 53/005* (2013.01); *F23D 14/16* (2013.01); *F23G 5/10* (2013.01); *F23G 7/063* (2013.01);
(Continued)

(58) Field of Classification Search
None
See application file for complete search history.

(56) References Cited

U.S. PATENT DOCUMENTS

2004/0152028 A1* 8/2004 Singh .................. F23D 14/14
431/328
2005/0135984 A1 6/2005 Ferron et al.

FOREIGN PATENT DOCUMENTS

| GB | 2285044 A | 6/1995 |
| WO | 2004068549 A2 | 8/2004 |
| WO | 2008122819 A1 | 10/2008 |

OTHER PUBLICATIONS

British Search Report dated Mar. 9, 2016 and Examination Report dated Mar. 10, 2016 for corresponding British Application No. GB1515489.1.

(Continued)

*Primary Examiner* — Anita Nassiri-Motlagh
(74) *Attorney, Agent, or Firm* — Westman, Champlin & Koehler, P.A.; Theodore M. Magee (57) ABSTRACT

The abatement apparatus includes a porous element at least partially defining a treatment chamber and through which treatment materials pass for introduction into the treatment chamber for treatment of an effluent gas stream; and an infra-red heating device operable to emit infra-red energy to heat the porous element which heats the treatment materials as they pass through the porous element into the treatment chamber. In this way, infra-red energy, rather than combustion, can be used to raise the temperature within the treatment chamber in order to treat the effluent gas stream. This allows the apparatus to be used in environments where no fuel gas exists or where the provision of fuel gas is considered undesirable. Also, heating the treatment materials as they pass through the porous sleeve, rather than simply using radiant heat to heat the treatment chamber enables signifi- (Continued)

cantly more energy to be imparted into the treatment materials.

10 Claims, 8 Drawing Sheets (51) Int. Cl.
  *F23G 5/10*    (2006.01)
  *F23G 7/06*    (2006.01)
  *H01L 21/67*   (2006.01)

(52) U.S. Cl.
  CPC .................. *H01L 21/67017* (2013.01); *B01D 2257/2066* (2013.01); *B01D 2259/80* (2013.01)

(56) References Cited

OTHER PUBLICATIONS

PCT Search Report and Written Opinion dated Nov. 7, 2016 for corresponding PCT Application No. PCT/GB2016/052598.

* cited by examiner

ABATEMENT APPARATUS

CROSS-REFERENCE OF RELATED APPLICATION

This application is a Section 371 National Stage Application of International Application No. PCT/GB2016/052598, filed Aug. 22, 2016, which is incorporated by reference in its entirety and published as WO 2017/037419 A1 on Mar. 9, 2017 and which claims priority of British Application No. 1515489.1, filed Sep. 1, 2015.

FIELD OF THE INVENTION

Embodiments relate to an abatement apparatus and method.

BACKGROUND

Abatement apparatus are known and are typically used for treating an effluent gas stream from a manufacturing processing tool used in, for example, the semiconductor or flat panel display manufacturing industry. During such manufacturing, residual perfluorinated compounds (PFCs) and other compounds exist in the effluent gas stream pumped from the process tool. PFCs are difficult to remove from the effluent gas and their release into the environment is undesirable because they are known to have relatively high greenhouse activity.

Known abatement apparatus use combustion to remove the PFCs and other compounds from the effluent gas stream. Typically, the effluent gas stream is a nitrogen stream containing PFCs and other compounds. A fuel gas is mixed with the effluent gas stream and that gas stream mixture is conveyed into a combustion chamber that is laterally surrounded by the exit surface of a foraminous gas burner. Fuel gas and air are simultaneously supplied to the foraminous burner to affect flameless combustion at the exit surface, with the amount of air passing through the foraminous burner being sufficient to consume not only the fuel gas supply to the burner, but also all the combustibles in the gas stream mixture injected into the combustion chamber.

Although techniques exist for processing the effluent gas stream, they each have their own shortcomings. Accordingly, it is desired to provide an improved technique for processing an effluent gas stream.

The discussion above is merely provided for general background information and is not intended to be used as an aid in determining the scope of the claimed subject matter. The claimed subject matter is not limited to implementations that solve any or all disadvantages noted in the background.

SUMMARY

According to a first aspect, there is provided an abatement apparatus for treating an effluent gas stream from a manufacturing processing tool, comprising: a porous element at least partially defining a treatment chamber and through which treatment materials pass for introduction into the treatment chamber for treatment of the effluent gas stream; and an infra-red heating device operable to emit infra-red energy to heat the porous element which heats the treatment materials as they pass through the porous element into the treatment chamber.

The first aspect recognizes that known abatement apparatus typically utilise fuel gas and air in order to provide combustion within the treatment chamber to raise the temperature within the treatment chamber sufficiently to remove the compounds from the effluent gas stream. This requires the provision of a fuel gas, which may not be readily available or which may be undesirable in some processing environments. Accordingly, an abatement or treatment apparatus may be provided. The apparatus may treat an effluent or process gas stream from a manufacturing processing tool. The apparatus may comprise a porous or foraminous element. That element may at least partially define a treatment chamber which may treat the effluent gas stream. Treatment materials may pass, be conveyed or transit through the element and into the treatment chamber. The apparatus may also comprise an infra-red heating device or element which may emit infra-red energy or radiation to heat the porous element. The heated porous element may then heat the treatment materials as they pass through the porous element into the treatment chamber. In this way, infra-red energy, rather than combustion, can be used to raise the temperature within the treatment chamber in order to treat the effluent gas stream. This provides for greater flexibility in the use of such apparatus since the apparatus can be used in environments where no fuel gas exists or where the provision of fuel gas is considered undesirable. Also, heating the treatment materials as they pass through the porous sleeve, rather than simply using radiant heat to heat the treatment chamber enables significantly more energy to be imparted into the treatment materials as they transit through the porous sleeve.

In one embodiment, the infra-red heating device is positioned proximate a surface of the porous element to heat the surface of the porous element. Hence, the infra-red heating device may be located near the porous element in order to heat it.

In one embodiment, the apparatus comprises an outer wall defining a plenum proximate the surface of the porous element, the treatment materials being provided to the porous element from the plenum and the infra-red heating device being located within the plenum. Accordingly, the plenum volume may be re-used to receive the infra-red heating device.

In one embodiment, the outer wall is reflective to reflect incident infra-red energy towards the porous element. Providing a reflective wall increases the amount of radiation directed towards the porous element.

In one embodiment, the outer wall comprises a cooler operable to cool the outer wall using the treatment materials prior to being provided to the plenum. This prevents the outer wall becoming too hot and pre-heats the treatment materials.

In one embodiment, the outer wall is one of curved and planar.

In one embodiment, the porous element defines a plenum proximate the surface of the porous element, the treatment materials being provided to the porous element from the plenum and the infra-red heating device being located within the plenum. Hence, the porous element itself may provide the plenum such as would occur with an outwardly radiant arrangement.

In one embodiment, the apparatus comprises a purge gas inlet operable to supply a purge gas surrounding the infra-red heating device. Surrounding or enveloping the infra-red heating device with a purge gas (which may contain treatment materials) helps to protect the infra-red heating device from damage.

In one embodiment, the surface of the porous element is configured to provide non-uniform absorption of incident infra-red energy. Hence, the energy imparted across the porous element may be varied to suit the required conditions within the treatment chamber.

In one embodiment, the porous element is configured to provide non-uniform transfer of heat from the surface to the treatment chamber. Hence, the energy imparted through the porous element may be varied to suit the required conditions within the treatment chamber.

In one embodiment, the porous element is one of curved and planar.

In one embodiment, the porous element is cylindrical and the outer wall is cylindrical, concentric with the porous element. Hence, the porous element may be coaxially surrounded by the outer wall.

In one embodiment, the infra-red heating device is configured to provide non-uniform infra-red energy emission. Hence, the energy emitted by the infra-red heating device may be varied to suit the required conditions within the treatment chamber.

In one embodiment, the infra-red heating device comprises one of an elongate element, a serpentine element and a coil element. It will be appreciated that the device may be provided in a variety of forms.

In one embodiment, the apparatus comprises a plurality of the infra-red heating devices positioned to emit infra-red energy to heat across the surface of the porous element. Accordingly, a number of infra-red heating devices may be provided, each heating a portion of the porous element.

In one embodiment, the apparatus comprises at least one inlet for conveying the effluent gas stream to the treatment chamber and wherein at least one infra-red heating device is located proximate each inlet. The helps to increase the heat or compensate for higher heat losses near the inlet.

In one embodiment, the apparatus comprises a controller operable to control the infra-red heating devices to vary emitted infra-red energy. Hence, the energy emitted by the infra-red heating device may be varied to suit the required conditions within the treatment chamber.

In one embodiment, the controller is operable to vary emitted infra-red energy based on a temperature of a treated effluent gas stream exiting the treatment chamber.

In one embodiment, the controller is operable to reduce emitted infra-red energy during intervals of reduced effluent gas stream flow. This helps to reduce energy.

In one embodiment, the controller is operable to cease emitted infra-red energy during non-processing intervals of the manufacturing processing tool. This helps to reduce energy during periods when processing is not occurring.

In one embodiment, the controller is operable to vary emitted infra-red energy based on a composition of the effluent gas stream.

According to a second aspect, there is provided a method, comprising: passing treatment materials through a porous element at least partially defining a treatment chamber for treatment of an effluent gas stream; and emitting infra-red energy using an infra-red heating device to heat the porous element which heats the treatment materials as they pass through the porous element into the treatment chamber.

In one embodiment, the method comprises positioning the infra-red heating device proximate a surface of the porous element to heat the surface of the porous element.

In one embodiment, the method comprises defining a plenum proximate the surface of the porous element using an outer wall, providing the treatment materials to the porous element from the plenum and locating the infra-red heating device within the plenum.

In one embodiment, the method comprises reflecting incident infra-red energy towards the porous element using the outer wall.

In one embodiment, the method comprises cooling the outer wall with a cooler using the treatment materials prior to being provided to the plenum.

In one embodiment, the outer wall is one of curved and planar.

In one embodiment, the method comprises defining a plenum proximate the surface of the porous element using the porous element, providing the treatment materials to the porous element from the plenum and locating the infra-red heating device within the plenum.

In one embodiment, the method comprises supplying a purge gas from a purge gas inlet to surround the infra-red heating device.

In one embodiment, the method comprises configuring the surface of the porous element to provide non-uniform absorption of incident infra-red energy.

In one embodiment, the method comprises configuring the porous element to provide non-uniform transfer of heat from the surface to the treatment chamber.

In one embodiment, the porous element is one of curved and planar.

In one embodiment, the porous element is cylindrical and the outer wall is cylindrical, concentric with the porous element.

In one embodiment, the method comprises configuring the infra-red heating device to provide non-uniform infra-red energy emission.

In one embodiment, the infra-red heating device comprises one of an elongate element, a serpentine element and a coil element.

In one embodiment, the method comprises positioning a plurality of the infra-red heating devices to emit infra-red energy to heat across the surface of the porous element.

In one embodiment, the method comprises conveying the effluent gas stream to the treatment chamber using at least one inlet and locating at least one infra-red heating device proximate each inlet.

In one embodiment, the method comprises controlling the infra-red heating devices to vary emitted infra-red energy.

In one embodiment, the method comprises varying emitted infra-red energy based on a temperature of a treated effluent gas stream exiting the treatment chamber.

In one embodiment, the method comprises reducing emitted infra-red energy during intervals of reduced effluent gas stream flow.

In one embodiment, the method comprises ceasing emitted infra-red energy during non-processing intervals of the manufacturing processing tool.

In one embodiment, the method comprises varying emitted infra-red energy based on a composition of the effluent gas stream.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

Embodiments will now be described further, with reference to the accompanying drawings, in which.

DETAILED DESCRIPTION

Before discussing the embodiments in any more detail, first an overview will be provided. Embodiments provide for an electrically-powered radiant apparatus, which enables an effluent gas stream from a manufacturing processing tool to be treated in situations where providing a fuel gas to raise the temperature of the treatment chamber is undesirable or simply not possible. Electrical energy is provided to infrared heating devices which emit infra-red energy to heat treatment materials as they pass through the porous sleeve into the treatment chamber by heating the porous sleeve which considerably increases the power density and the achievable temperature within the treatment chamber.

Inward Heating Arrangement

Figure 1:
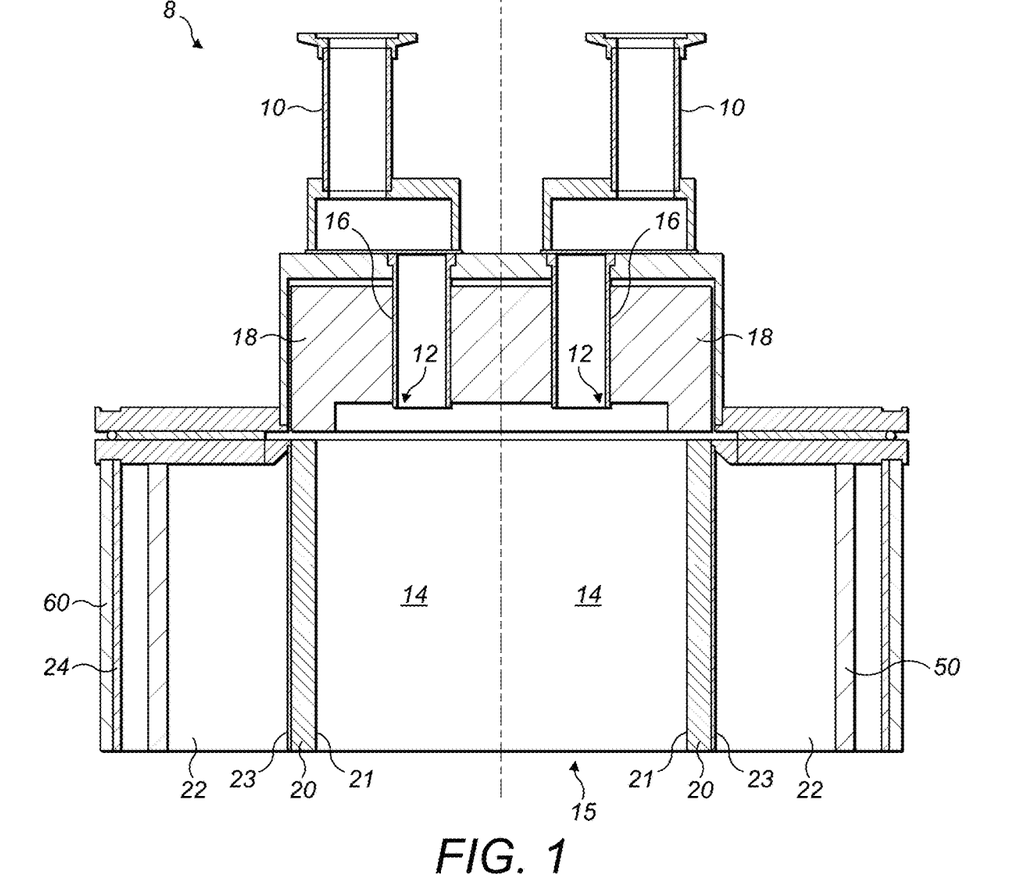
FIG. 1 is a cross section schematic through an abatement apparatus assembly according to one embodiment.

FIG. 1 is a cross section schematic through an abatement apparatus assembly, generally 8, according to one embodiment. The abatement apparatus assembly 8 treats an effluent gas stream pumped from a manufacturing process tool such as a semiconductor or flat panel display process tool, typically by means of a vacuum-pumping system. The effluent stream is received at inlets 10. The effluent stream is conveyed from the inlet 10 to a nozzle 12 which injects the effluent stream into a cylindrical treatment chamber 14. In this embodiment, the radiant apparatus assembly 8 comprises four inlets 10 arranged circumferentially, each conveying an effluent gas stream pumped from a respective tool by a respective vacuum-pumping system. Alternatively, the effluent stream from a single process tool may be split into a plurality of streams, each one of which is conveyed to a respective inlet. Each nozzle 12 is located within a respective bore 16 formed in a ceramic top plate 18 which defines an upper or inlet surface of the treatment chamber 14.

The treatment chamber 14 has side walls defined by an exit surface 21 of a foraminous sleeve 20 in the form of a cylindrical tube. The foraminous sleeve 20 is made of a material which is suitable for absorbing infra-red radiation in order to be heated. The foraminous sleeve 20 may have a surface with non-uniform infra-red absorption characteristics so that some parts of the foraminous sleeve 20 get hotter than others. Also, the foraminous sleeve 20 may have non-uniform heat transfer characteristics so that some parts of the exit surface get hotter than others. The foraminous sleeve 20 is cylindrical, typically 80% to 90% porous, with a pore size between 200 μm and 800 μm.

A plenum volume 22 is defined between an entry surface 23 of the foraminous sleeve 20 and a cylindrical outer shell 24. The cylindrical outer shell 24 is concentrically enclosed within an outer insulating sleeve 60 in order to reduce the outer surface temperature to safe levels should the temperature of the cylindrical outer shell 24 become raised due to, for example, stray heating. Additional, or alternatively, a cooler may be located within or against the outer shell in order to provide cooling. An inner surface of the cylindrical outer shell 24 is reflective to reflect incident infra-red radiation towards the foraminous sleeve 20.

A gas is introduced into the plenum volume 22 via an inlet nozzle (not shown). The gas may be air, or a blend of air and other species such as water vapour, $CO_2$. In this example, humidified air is introduced and the humidified air passes from the entry surface 23 to the exit surface 21 of the foraminous sleeve 20 and is heated as is passes through the foraminous sleeve 20.

An infra-red heating mechanism is used and so the plenum volume 22 also contains infra-red devices 50 connected to a power supply (not shown) for heating the foraminous sleeve 20 by infra-red radiation. The infra-red device 50 is in this example an elongate infra-red emitter. However, it will be appreciated that a variety of different infra-red devices may be used. The infra-red devices 50 are distributed within the plenum volume 22 in order to provide the required heating around the foraminous sleeve 20, minimising shadowing. Heating can be enhanced locally by locating infra-red devices 50 near to the inlets 10. The infra-red devices 50 may provide non-uniform energy emission to vary the heating of the foraminous sleeve 20. The gas introduced into the plenum volume 22 may be introduced as shrouds to surround and protect the infra-red devices 50.

Figure 2:
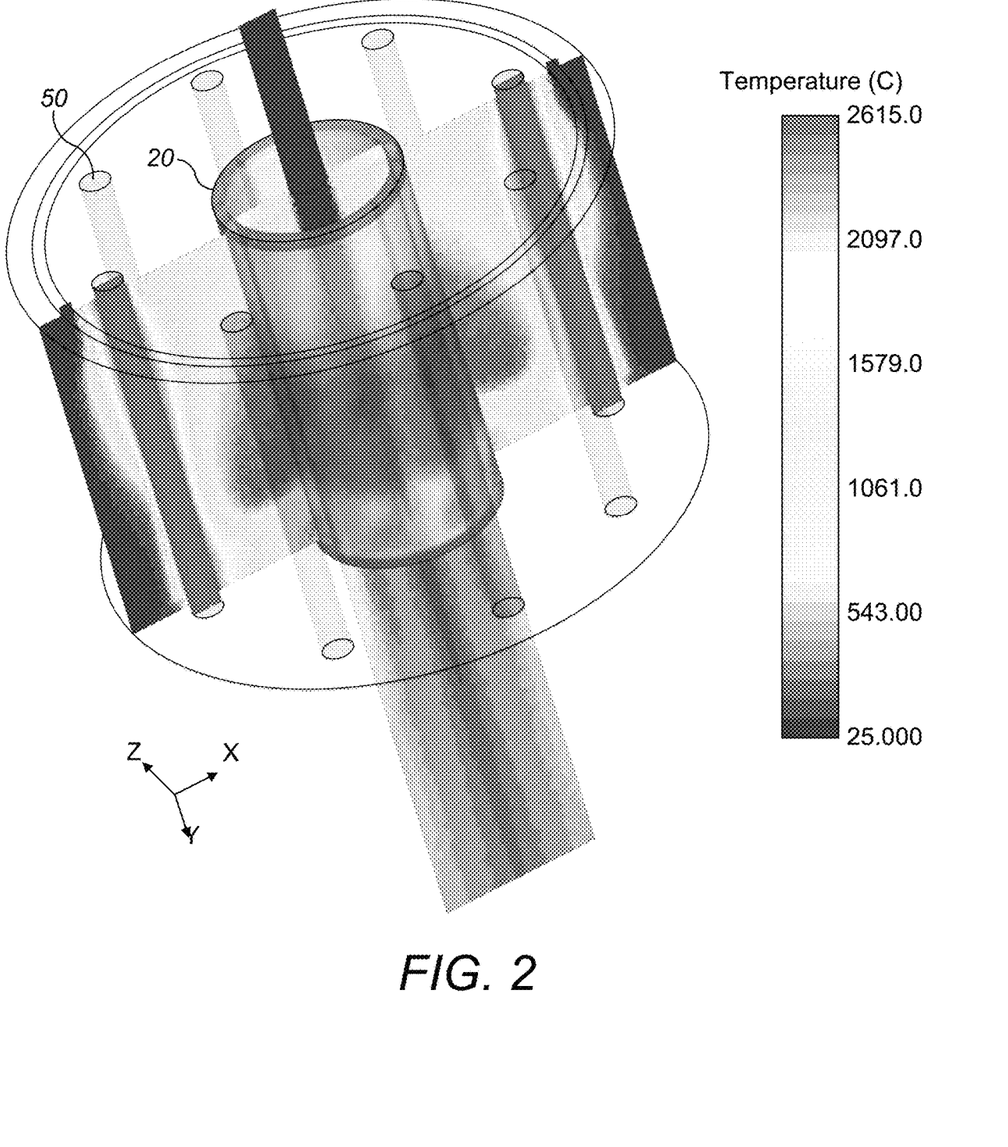
FIG. 2 is a temperature profile simulation schematic showing the temperature profile across a plane within the abatement apparatus assembly of FIG. 1.

FIG. 2 is a temperature profile simulation schematic showing the temperature profile across a plane within the abatement apparatus assembly 8. Infra-red energy incident on the foraminous sleeve 20 heats the foraminous sleeve 20. This in turn heats the humidified air as it passes from an entry surface 23 of the foraminous sleeve 20 to the exit surface 21 of the foraminous sleeve 20. In addition, the heat generated by the foraminous sleeve 20 raises the temperature within the treatment chamber 14. The amount of infra-red energy supplied to the foraminous sleeve 20 is varied to vary the nominal temperature within the treatment chamber 14 to that which is appropriate for the effluent gas stream to be treated. For example, the foraminous sleeve 20 (having an example diameter of 150 mm and an example length of 300 mm) is heated to between 800° C. and 1200° C. and the humidified air is likewise heated to this temperature.

Heating is achieved by supplying electrical energy at a level of typically between around 10 kW and 20 kW applied to the foraminous sleeve 20 having the above example dimensions. This provides for a foraminous sleeve 20 surface area of $\pi \times 0.15 \times 0.3 = 0.14$ m$^2$ and an equivalent power density of between around 70 kWm$^{-2}$ and 140 kWm$^{-2}$. The applied power is related to the flow rate of air through the foraminous sleeve 20. In this example simulation, the infra-red devices were supplied with 1.625 kW of electrical power each, making a total of 13 kW of power. The gas flow from the plenum volume 22 to the treatment chamber 14 was flowing at 245 standard litres per minute and the effluent gas stream entering the inlets 10 was flowing at standard litres per minute.

One skilled in the art would recognise that other conditions of power, air flow and temperature are possible. The effluent gas stream containing noxious substances to be treated is caused to mix with this hot gas in a known manner in the treatment chamber 14. The exhaust 15 of the treatment chamber 14 is open to enable the combustion products to be output from the radiant apparatus assembly 8 and received typically by a water weir (not shown) in accordance with known techniques.

Accordingly, it can be seen that the effluent gas received through the inlets 10 and provided by the nozzles 12 to the treatment chamber 14 is treated within the treatment chamber 14, which is heated by the foraminous sleeve 20. The humidified air provides products, such as oxygen (typically with a nominal range of 7.5% to 10.5%), as well as water (typically with a nominal range of 10% to 14%, and preferably 12%), depending whether or not oxygen enrichment occurs and on the humidity of the air, to the treatment chamber 14. The heat breaks down and/or the products react with the effluent gas stream within the treatment chamber 14 to clean the effluent gas stream. For example, $SiH_4$ and $NH_3$ may be provided within the effluent gas stream, which reacts with $O_2$ within the treatment chamber 14 to generate $SiO_2$, $N_2$, $H_2O$, $NO_X$. Similarly, $N_2$, $CH_4$, $C_2F_6$ may be provided within the effluent gas stream, which reacts with $O_2$ within the treatment chamber 14 to generate $CO_2$, HF, $H_2O$. Likewise, $F_2$ may be provided within the effluent gas stream, which reacts with $H_2O$ within the treatment chamber 14 to generate HF, $H_2O$.

Outward Heating Arrangement

Figure 3:
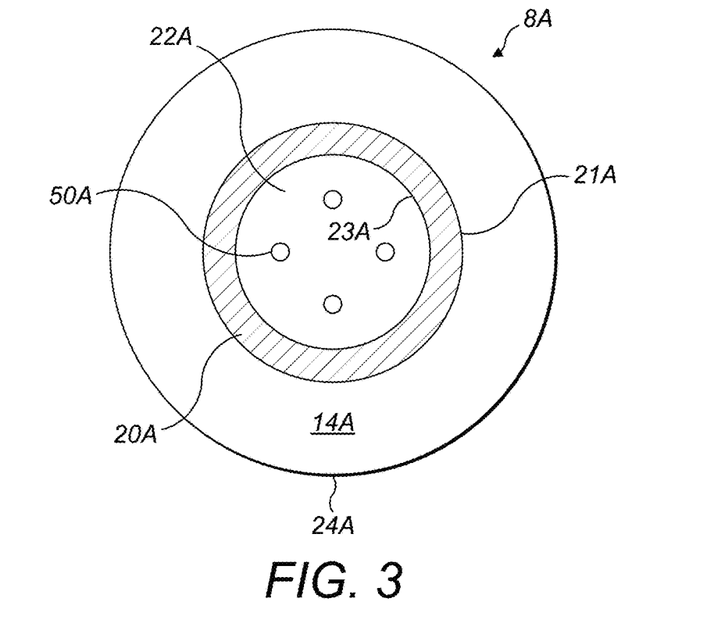
FIG. 3 illustrates schematically an abatement apparatus assembly according to one embodiment.

FIG. 3 illustrates schematically an abatement apparatus assembly, generally 8A, according to one embodiment. This arrangement is similar to that of FIG. 1, but the infra-red devices 50A are located within the foraminous sleeve 20A which defines the plenum volume 22A. The infra-red devices 50A are distributed within the plenum volume 22A in order to provide the required heating around the foraminous sleeve 20A, minimising shadowing. Heating can be enhanced locally by locating infra-red devices 50A near to the inlets. The infra-red devices 50A may provide non-uniform energy emission to vary the heating of the foraminous sleeve 20A. The gas introduced into the plenum volume 22A may be introduced as shrouds to surround and protect the infra-red devices 50A.

Infra-red energy incident on the foraminous sleeve 20A heats the foraminous sleeve 20A. This in turn heats the humidified air as it passes from an entry surface 23A of the foraminous sleeve 20A to the exit surface 21A of the foraminous sleeve 20A. In addition, the heat generated by the foraminous sleeve 20A raises the temperature within the treatment chamber 14A. The amount of infra-red energy supplied to the foraminous sleeve 20A is varied to vary the nominal temperature within the treatment chamber 14A to that which is appropriate for the effluent gas stream to be treated.

Inward & Outward Heating Arrangement

Figure 4:
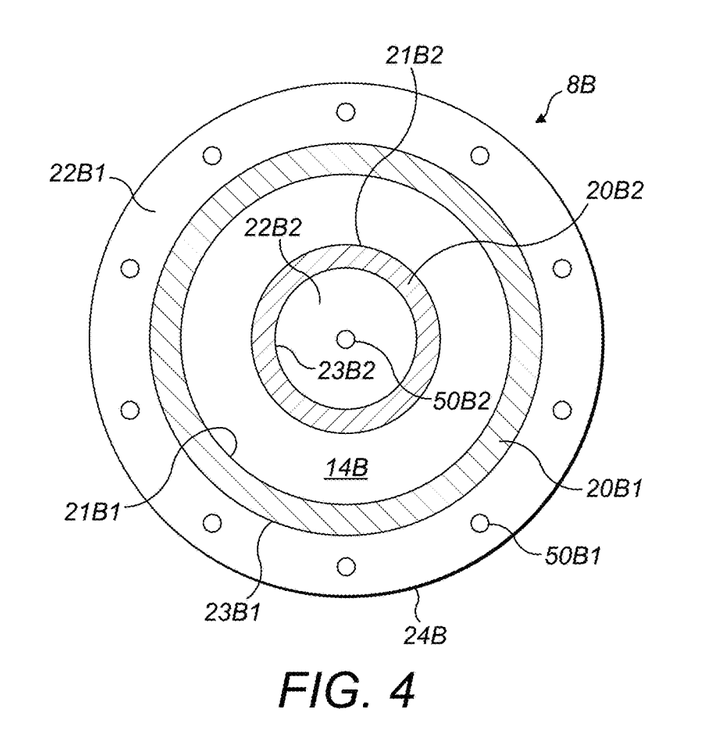
FIG. 4 illustrates schematically an abatement apparatus assembly according to one embodiment.

FIG. 4 illustrates schematically an abatement apparatus assembly, generally 8B, according to one embodiment. This arrangement is similar to that of FIGS. 1 and 3, but the infra-red devices 50B1, 50B2 are located both around the foraminous sleeve 20B1 which partially defines the plenum volume 22B1 and within the foraminous sleeve 20B2 which defines the plenum volume 22B2. The infra-red devices 50B1, 50B2 are distributed within the plenum volume 22B1, 22B2 in order to provide the required heating around the foraminous sleeve 20B1, 20B2, minimising shadowing. Heating can be enhanced locally by locating infra-red devices 50B1, 50B2 near to the inlets. The infra-red devices 50B1, 50B2 may provide non-uniform energy emission to vary the heating of the foraminous sleeve 20B1, 20B2. The gas introduced into the plenum volume 22B1, 22B2 may be introduced as shrouds to surround and protect the infra-red devices 50B1, 50B2.

Infra-red energy incident on the foraminous sleeve 20B1, 20B2 heats the foraminous sleeve 20B1, 20B2. This in turn heats the humidified air as it passes from an entry surface 23B1, 23B2 of the foraminous sleeve 20B1, 20B2 to the exit surface 21B1, 21B2 of the foraminous sleeve 20B1, 20B2. In addition, the heat generated by the foraminous sleeve 20B1, 20B2 raises the temperature within the treatment chamber 14B. The amount of infra-red energy supplied to the foraminous sleeve 20B1, 20B2 is varied to vary the nominal temperature within the treatment chamber 14B to that which is appropriate for the effluent gas stream to be treated.

Planar Arrangement—Single Row

Figure 5A:
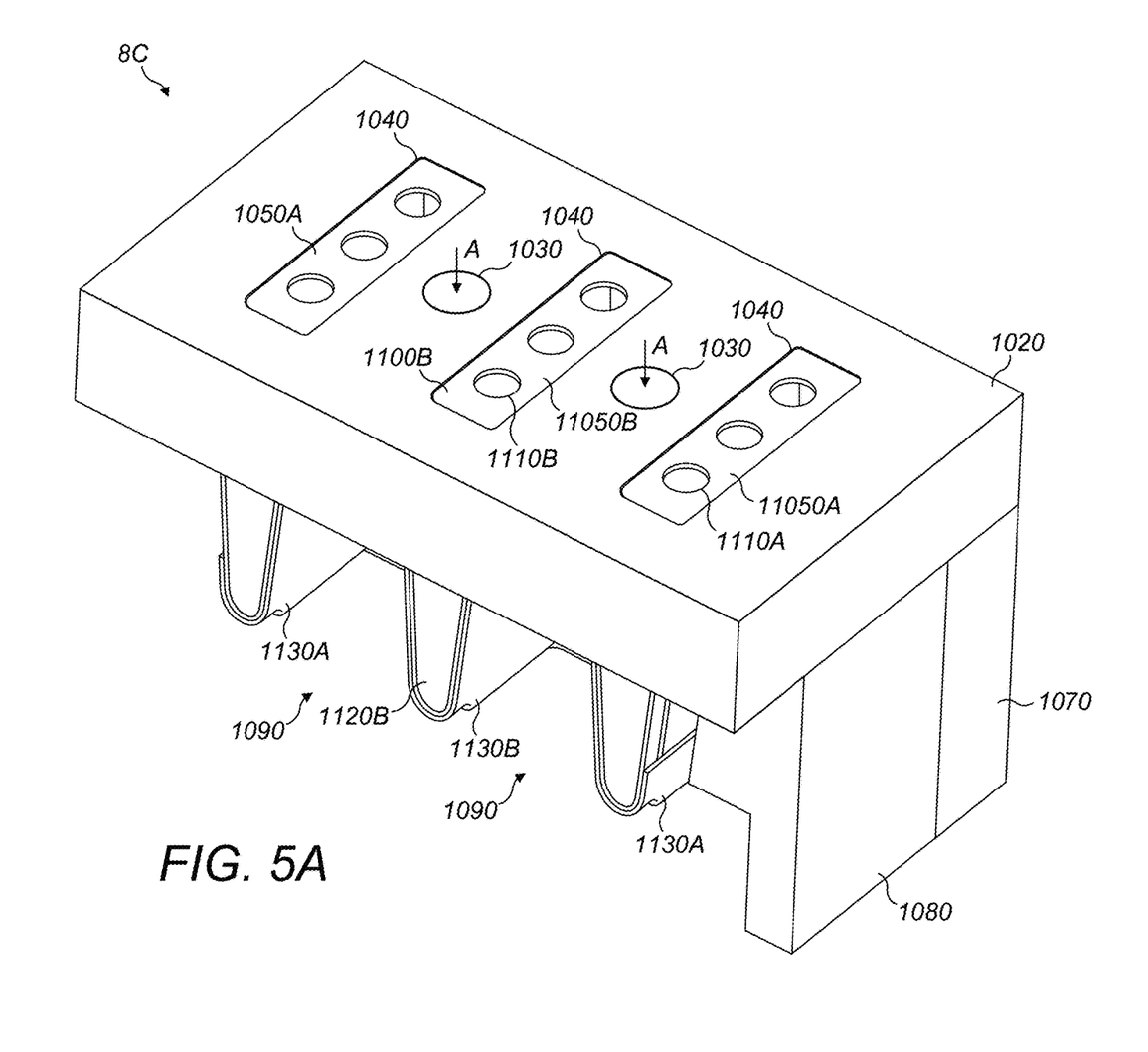
FIGS. 5A and 5B illustrate an abatement apparatus according to one embodiment.
Figure 5B:
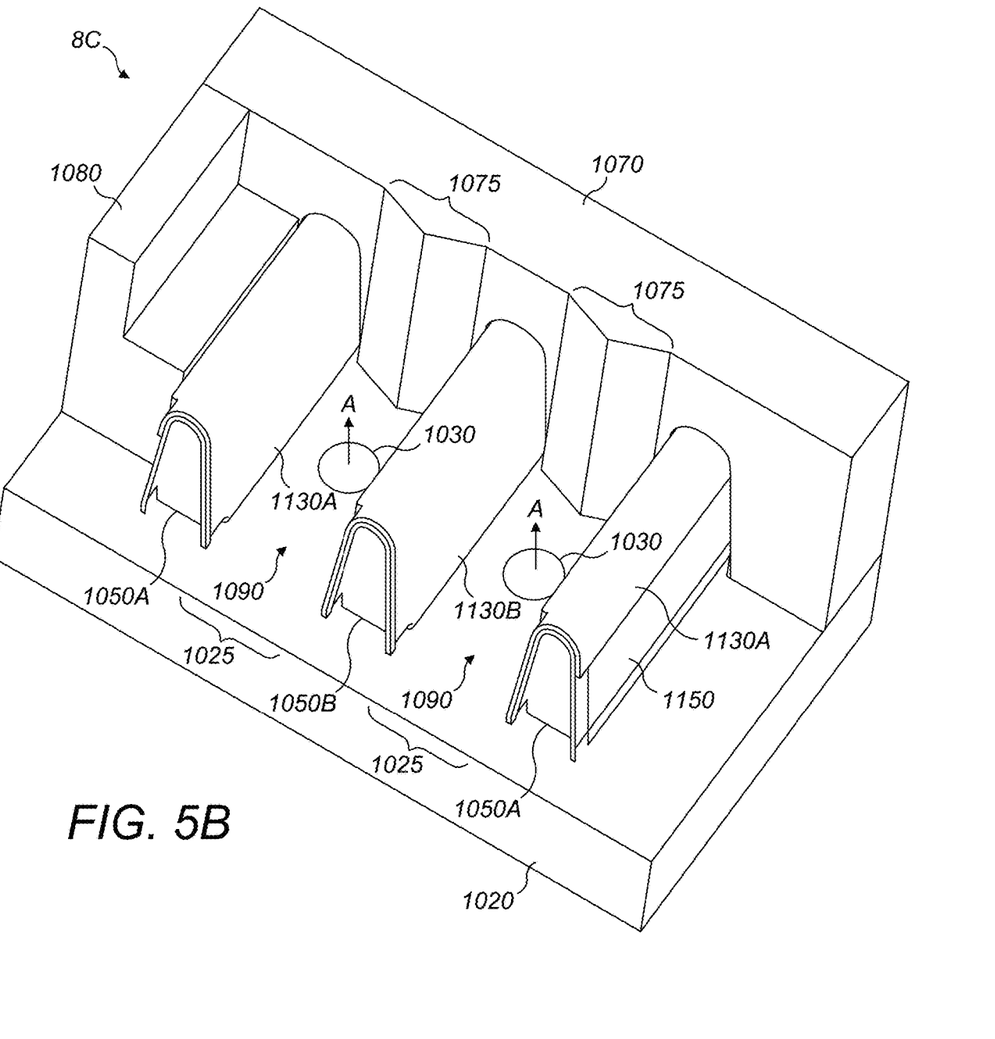

FIGS. 5A and 5B illustrate an abatement apparatus, generally 8C, according to one embodiment. In order to improve clarity, a side wall and end wall have been omitted. The abatement apparatus 8C comprises an upper portion 1020 of a housing. The upper portion 1020 comprises a plurality of effluent stream inlets 1030 for receiving an effluent stream to be treated. The upper portion 1020 also comprises a plurality of apertures 1040 shaped to receive either a separating structure or an end structure. In this example, the upper portion 1020 receives two end structures 1050A and one separating structure 1050B. The abatement apparatus 8C comprises a pair of opposing sidewalls 1070 (only one of which is shown in FIGS. 5A and 5B), together with a pair of end walls 1080 (again, only a single end wall 1080 is shown in FIGS. 5A and 5B).

The upper portion 1020, together with the side walls 1070 and the end walls 1080, create a box-like housing having an open face into which the separating structure 1050B and end structures 1050A extend. The separating structure 1050B and end structures 1050A partition up the space within the housing to define individual treatment chambers 1090. In this embodiment, each treatment chamber 1090 is therefore bounded by a separating structure 1050B and an end structure 1050A, as well as by portions 1075 of the side walls 1070 and portions 1025 of the upper portion 1020. To simplify construction, the separating structure 1050B and the end structures 1050A have the same dimensional configuration.

In this embodiment, the separating structure 1050B has a rectangular upper face 1100B in which is provided with three equally-spaced treatment material inlet apertures 1110B. The upper face 1100B is received within a central aperture 1040. A sheet 1130B of foraminous material is coupled with the two major sides of the upper face 1100B and extends into the housing. The sheet 1130B is curved at a position furthermost from the face 1100B. A pair of opposing end plates 1120B are located proximate to opposing edges of the sheet 1130B in order to enclose a space within the separating structure 1050B and into which the treatment materials pass via the treatment material inlets 1110B. In this embodiment, the treatment materials are pumped into the void within the separating structure 1050B, these then pass through the sheet 1130B.

The end structures 1050A are of substantially the same construction as the separating structure 1050B, but the sheet 1130A of foraminous material terminates after the bend and a non-porous blanking plate 1150 is provided adjacent the facing end walls 1080. This ensures that the treatment materials provided via the treatment material inlet apertures 1110A are only provided in the vicinity of the treatment chambers 1090.

The effluent gas stream to be treated is split into individual flows, one to be treated in each of the separate treatment chambers 1090. In this embodiment, the effluent gas stream is split into two flows, one to be treated in each of the two different treatment chambers 1090 via the effluent stream inlets 1030. Treatment materials are provided to the treatment material inlet apertures 1110A, 1110B. Abatement of the effluent gas stream occurs within the treatment chambers 1090.

As can be seen in FIGS. 5A and 5B, the end structures 1050A and the separating structure 1050B are arranged to be generally parallel to each other in order to provide for uniform conditions within each treatment chamber 1090. The end structures 1050A and separating structure 1050B are inwardly tapered in the direction of the effluent stream flow A in order to accommodate expansion of the effluent stream as it is heated within each treatment chamber. This helps to reduce the impact of any residues on the sheets 1130A, 1130B.

The provision of the curved portion of the sheets 1130A, 1130B helps to prevent residue deposits in that region and provides additional heating at a region of the treatment chamber 1090 which experiences high heat loss.

The portions 1075 of the side walls 1070 are tapered or faceted into the treatment chamber 1090 in order to urge by-products away from those surfaces and reduce residue deposits thereon. Hence, it can be seen that each treatment chamber 1090 provides a uniform space within which a portion of the effluent stream is processed.

Although in this embodiment, two treatment chambers 1090 are provided, the number of treatment chambers 1090 can be easily changed by changing the number of separating structures 1050B. This provides a completely scalable architecture which can treat any flow rate of the effluent gas stream. For example, should double the rate of effluent gas stream need to be processed, then four instead of two treatment chambers 1090 may be provided through the provision of three separating structures 1050B and two end structures 1050A. Since the performance of each individual treatment chamber 1090 is validated, the performance of a larger number of those treatment chambers can also be assured.

Planar Arrangement—Array

Figure 6A:
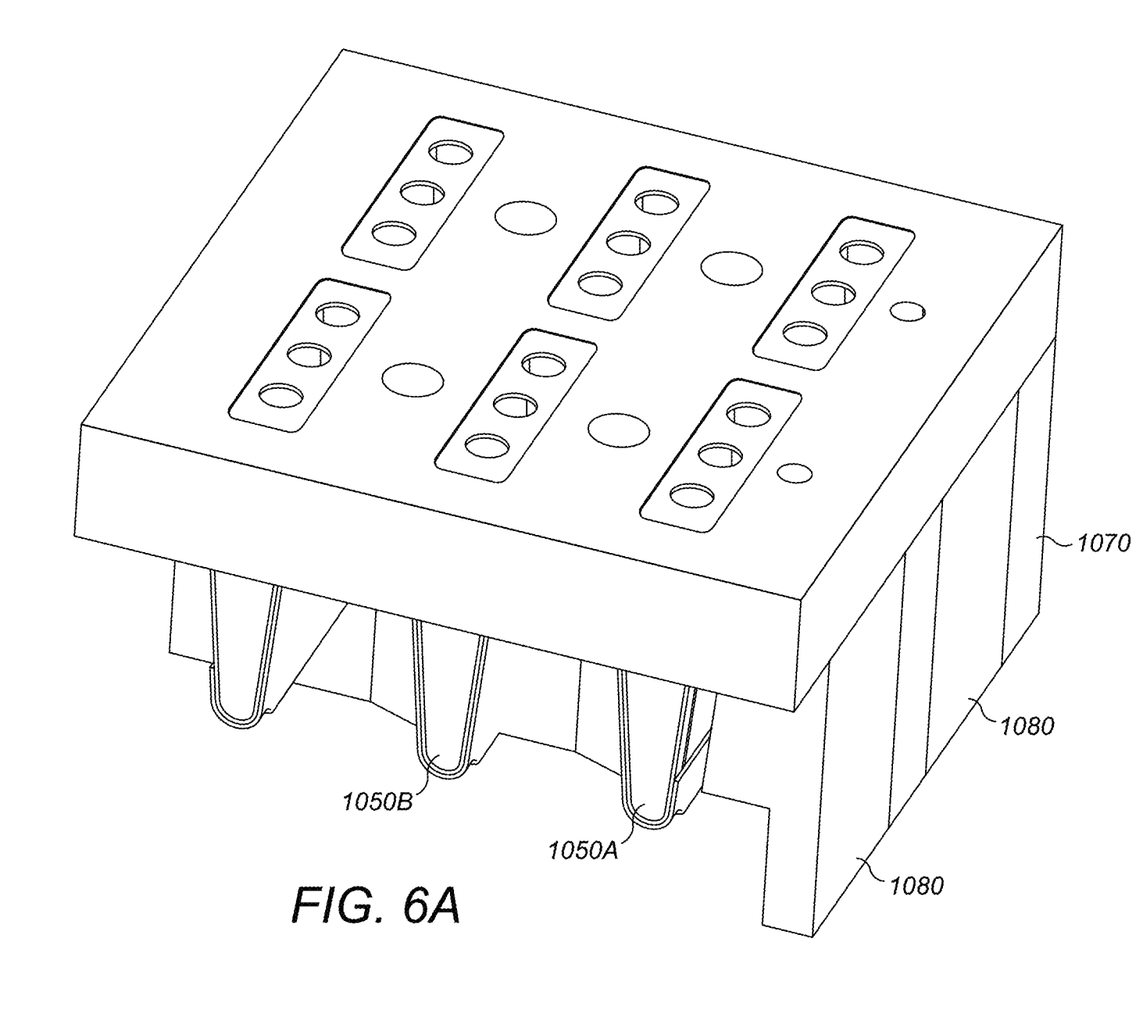
FIGS. 6A and 6B illustrate an abatement apparatus according to one embodiment.
Figure 6B:
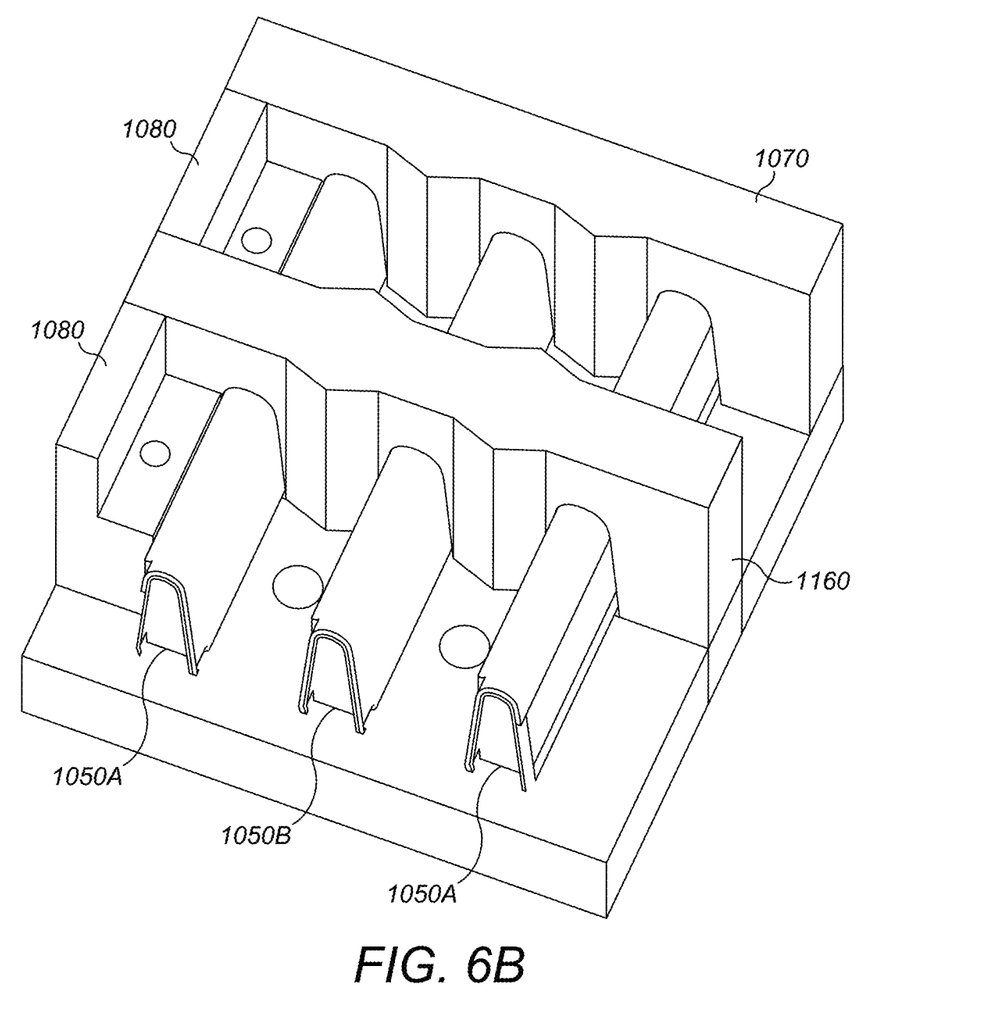

FIGS. 6A and 6B illustrate an alternative arrangement for treating double the flow rate of effluent gas stream compared to that treated by the arrangement shown in FIGS. 5A and 5B. In this embodiment, the arrangement of FIGS. 1A and 1B is duplicated to provide two rows of treatment chambers 1090, separated by an intervening wall 1160 (again, a sidewall 1070 and end wall 1080 has been omitted to improve clarity).

Hence, it can be seen that many of the component parts may simply be reused in order to scale the radiant apparatus for a new flow rate of effluent gas stream. For example, if one treatment chamber 1090 is configured to treat one hundred standard litres of effluent gas stream and four hundred standard litres of effluent gas stream are required to be treated, then an arrangement such as that illustrated in FIGS. 6A and 6B may be utilized which has four treatment chambers 1090, each of which is able to treat one hundred standard litres per minute of effluent gas stream, totalling four hundred standard litres per minute.

In another embodiment, rather than having the intervening wall 1160, instead a structure similar to the separating structures 1050B are provided, which separate one treatment chamber 1090 from another. In other words, separating structures 1050B are provided in place of the intervening wall 1160 and are orientated orthogonally with respect to the separating structures 1050B illustrated in FIGS. 6A and 6B. This provides for combustion on more than two sides of each treatment chamber 1090.

Whichever arrangement is used, the treated effluent stream from each treatment chamber 1090 exhaust or vents via the open face of the housing into a downstream cooling chamber (not shown).

Figure 7:
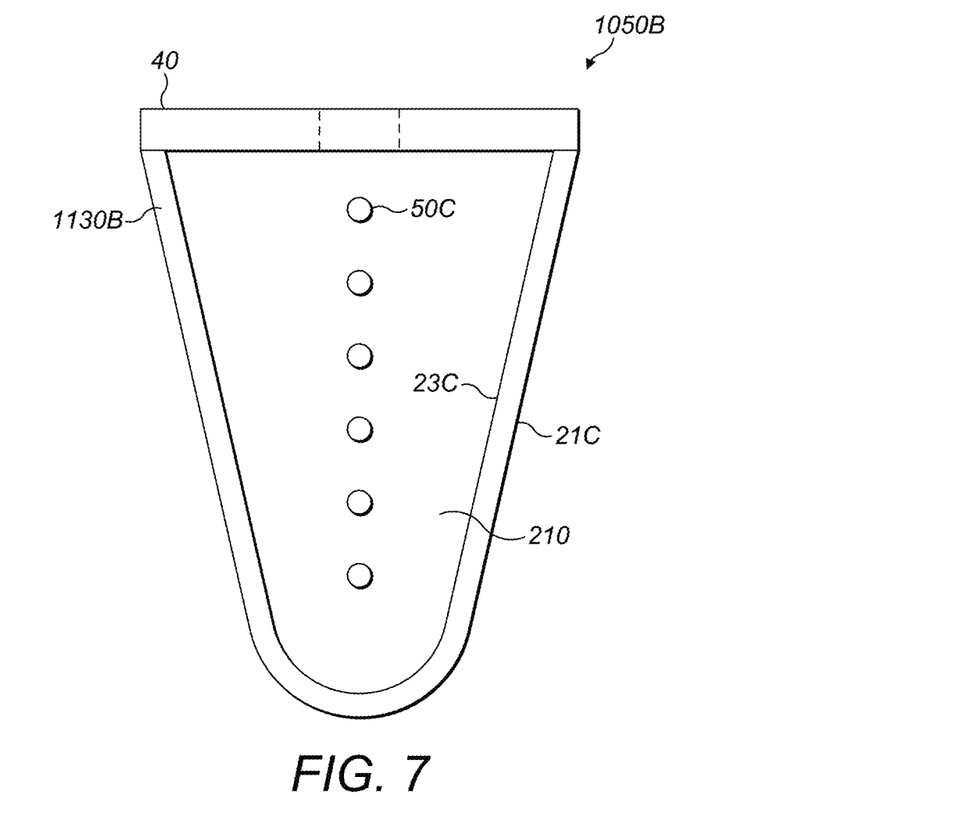
FIG. 7 is a cross section through a separating structure according to one embodiment.

In both arrangements shown in FIGS. 5A, 5B, 6A and 6B, infra-red heating of the treatment chamber 1090 occurs using a separating structure 1050B, as shown in FIG. 7 which is a cross section through the separating structure 1050B. The end structures 1050A are similarly arranged to facilitate infra-red heating. In this embodiment, sheet 1130B is made of a material which is suitable to absorb infra-red radiation. The sheet 1130B is typically 80% to 90% porous, with a pore size between 200 μm and 800 μm. The sheet 1130B may be configured to provide non-uniform infra-red absorption and non-uniform heat transmission.

In this embodiment, the treatment gas may be air, or a blend of air and other species such as water vapour, $CO_2$. In this example, humidified air is introduced and the humidified air passes from an entry surface 23C to an exit surface 21C of the sheet 1130B. The void 210 also contains a infra-red device 50C (which follows a serpentine or other winding path within the void 210) and which is connected to a power supply (not shown) for heating the sheet 1130B by infra-red radiation.

Infra-red radiation supplied to the sheet 1130B heats the sheet 1130B. This in turn heats the humidified air as it passes from an entry surface 23C to the exit surface 21C of the sheet 1130B. In addition, the heat generated by the sheet 1130B raises the temperature within the treatment chamber 1090. The amount of infra-red radiation supplied to the sheet 1130B is varied to vary the nominal temperature within the treatment chamber 1090 to that which is appropriate for the effluent gas stream to be treated. For example, the sheet 1130B is heated to between 800° C. and 1200° C. and the humidified air is likewise heated to this temperature. This is achieved by supplying electrical energy at a level of typically between around 10 kW and 20 kW applied to sheet 1130B. This provides an equivalent power density of between around 70 $kWm^{-2}$ and 140 $kWm^{-2}$. The applied power is related to the flow rate of air through the sheet 1130A, 1130B. One skilled in the art would recognise that other conditions of power, air flow and temperature are possible. The effluent gas stream containing noxious substances to be treated is caused to mix with this hot gas in a known manner in the treatment chamber 1090. The exhaust of the treatment chamber 1090 is open to enable the combustion products to be output from the radiant apparatus and received typically by a water weir (not shown) in accordance with known techniques.

Accordingly, it can be seen that embodiments provide an infra-red heated abatement device, which provides for non-fuel-based abatement employing infra-red heating of a reaction chamber with gas permeable walls. Embodiments recognise that there is a requirement for non-fuel based abatement with equivalent performance to inwardly-fired combustors. One approach uses an inductively-heated sintered metal sleeve though which oxygen/water vapour/nitrogen can be passed to act as a proxy for the combustor.

Such an approach requires a dedicated radio-frequency power supply, whereas by using infra-red heating elements, the design can be simplified.

In embodiments, one or more gas treatment chambers have an inlet and an outlet with porous boundary surfaces heated by one or more infra-red sources placed externally to the treatment chamber. The porous heated surfaces are infused with gases which serve to maintain the cleanliness of the inner surfaces and may adventitiously contain oxygen, water vapour or other reactive species to bring about destruction of gases conveyed into the treatment chamber by the thermal generation of radicals to interact with the gas to be treated.

In embodiments, a cylindrical housing acts as a reflector to direct infra-red radiation from sources onto the outer surface of a porous inner cylinder. Gas flows from annular plenum containing the heaters through the walls of the inner cylinder and is thus heated to the point where it reacts with the gas stream entering via the inlet shown.

Embodiments afford a means of non-fuel abatement similar to an inductive heated reaction chamber but the walls need not conduct electricity, only absorb infra-red radiation and transfer heat to the gas flowing through them. This system has low radio-frequency/magnetic interference and the placement and number of heaters may be varied to create and adventitious temperature profile down the axis of the reaction chamber. The porosity/thickness of the infra-red susceptor tube may be tailored to further influence the temperature gradient or gas flow, for example, a hot, well-purged zone at the inlet. There are opportunities for a modular configuration in planar arrangements.

Embodiments can be varied to reflect the various nozzle and inject strategies currently employed. There may be any number of radiant heaters or discrete reaction chambers. This provides for highly configurable systems and a non-fuel solution, which offers rapid heating and potential for cost-savings in modular embodiments by only heating discrete zones.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. An abatement apparatus for treating an effluent gas stream from a manufacturing processing tool, comprising:
   a porous element having a first side at least partially defining a treatment chamber and a second side at least partially defining a plenum;
   an infra-red heating device located on the second side of the porous element in the plenum and operable to emit infra-red energy to heat said porous element;
   and a treatment material inlet on the second side of the of the porous element and configured to provide treatment materials to the plenum such that the treatment materials flow from the plenum through the porous element, which heats said treatment materials as they pass through said porous element into said treatment chamber so that the treatment materials react with said effluent gas stream.

2. The abatement apparatus of claim 1, comprising an outer wall defining the plenum.

3. The abatement apparatus of claim 2, wherein said outer wall is reflective to reflect incident infra-red energy towards said porous element.

4. The abatement apparatus of claim 1, comprising a purge gas inlet operable to supply a purge gas surrounding said infra-red heating device.

5. The abatement apparatus of claim 1, wherein said the second side of porous element is configured to provide non-uniform absorption of incident infra-red energy.

6. The abatement apparatus of claim 1, wherein said porous element is configured to provide non-uniform transfer of heat from the first side of the porous element to said treatment chamber.

7. The abatement apparatus of claim 1, wherein said infra-red heating device is configured to provide non-uniform infra-red energy emission.

8. The abatement apparatus of claim 1, comprising a plurality of said infra-red heating devices positioned to emit infra-red energy to heat across the second side of said porous element.

9. The abatement apparatus of claim 1, comprising a controller operable to control said infra-red heating device to vary emitted infra-red energy.

10. The abatement apparatus of claim 9, wherein said controller is operable to perform at least one of: reduce emitted infra-red energy during intervals of reduced effluent gas stream flow; cease emitted infra-red energy during non-processing intervals of said manufacturing processing tool; and vary emitted infra-red energy based on a composition of said effluent gas stream.

* * * * *